United States Patent
Lucas et al.

(10) Patent No.: US 7,935,547 B2
(45) Date of Patent: May 3, 2011

(54) METHOD OF PATTERNING A LAYER USING A PELLICLE

(75) Inventors: Kevin Lucas, Meylan (FR); Kyle Patterson, Arlington, TX (US); Sergei Postnikov, Grenoble (FR)

(73) Assignee: Freescale Semiconductor, Inc., Austin, TX (US)

(*) Notice: Subject to any disclaimer, the term of this patent is extended or adjusted under 35 U.S.C. 154(b) by 270 days.

(21) Appl. No.: 12/279,672

(22) PCT Filed: Feb. 17, 2006

(86) PCT No.: PCT/EP2006/003293
§ 371 (c)(1),
(2), (4) Date: Dec. 18, 2008

(87) PCT Pub. No.: WO2007/093194
PCT Pub. Date: Aug. 23, 2007

(65) Prior Publication Data
US 2009/0130865 A1 May 21, 2009

(51) Int. Cl.
*H01L 21/00* (2006.01)
(52) U.S. Cl. .................. 438/7; 438/16; 430/5
(58) Field of Classification Search .......... 430/5; 438/7, 438/16
See application file for complete search history.

(56) References Cited

U.S. PATENT DOCUMENTS

| 5,229,229 A | 7/1993 | Sato et al. |
| 5,453,830 A | 9/1995 | Greed, Jr. |
| 5,661,601 A | 8/1997 | Kang et al. |
| 5,820,950 A * | 10/1998 | Wang .............................. 428/14 |
| 6,824,930 B1 | 11/2004 | Wheland et al. |

FOREIGN PATENT DOCUMENTS

| DE | 10240085 A1 | 4/2004 |
| DE | 10351607 A1 | 6/2005 |
| EP | 0373923 A2 | 6/1990 |
| JP | 04130711 A | 5/1992 |
| JP | 06347999 A | 12/1994 |
| JP | 2005241782 A | 9/2005 |
| WO | 9522085 A | 8/1995 |

* cited by examiner

*Primary Examiner* — Richard A. Booth

(57) ABSTRACT

A method for patterning a layer on a semiconductor substrate includes forming a layer of a semiconductor substrate and exposing the layer to light. The light travels through a second pellicle that is manufactured by a method that includes determining a first transmission of a first light through a first pellicle, wherein the first light is normal to the first pellicle, determining a second transmission of a second light through the first pellicle, wherein the second light is not normal to the first pellicle, and modifying the first pellicle to form a second pellicle using the first and second transmission.

10 Claims, 2 Drawing Sheets

US 7,935,547 B2

METHOD OF PATTERNING A LAYER USING A PELLICLE

FIELD OF THE INVENTION

This invention relates generally to forming a semiconductor device using a pellicle.

BACKGROUND OF THE INVENTION

A pellicle is a thin film for protecting a mask, which is used to pattern a layer on a semiconductor substrate, from airborne contamination, such as dust, so that the airborne contamination does not cause the pattern to be misprinted on the semiconductor substrate. Since the pellicle undesirably collects dust, the pellicle needs to be far enough away (e.g., a couple of millimeters) from the reticle so that the dust and other particles on the pellicle do not print. To avoid affecting the photolithography process, the pellicle is a transparent film.

As light travels through the mask and then through the pellicle, light is reflected at the first interface between the environment (external reflection) and the pellicle, and some of it is reflected within the pellicle (internal reflection). The materials and thickness for the pellicle are chosen so that the internal and external reflections of light travelling normal to the pellicle cancel each other so that light transmission is optimized.

Prior art pellicles used in semiconductor manufacturing are thin (i.e., thickness less than 3 um) organic polymer films. The prior art also contains research into thick (i.e., thickness greater than 600 um) inorganic substrates which provide mask contamination control and function optically as removable photolithographic lens elements. These thick inorganic substrates have been named "hard-pellicles" and are made from materials such as modified fused silica. Prior art pellicles are only optimized for light entering the pellicle at angles normal to the pellicle, although non-normal angles have been considered when designing lenses in photolithographic systems and for thick inorganic hard-pellicles. In addition, prior art pellicles have not included anti-reflective coatings, although such coatings have been used on a semiconductor wafer to decrease reflection during photolithographic patterning, on optical lens elements and have been considered for thick inorganic hard-pellicles. Furthermore, it is known that quarter wave plates are effective at optimizing transmitted light intensity in optical systems.

As semiconductor device features (e.g., transistor length) decrease in size, the angle of the light travelling through the pellicle increases. Thus, as semiconductor device feature sizes decrease the pellicles used for large device features are no longer optimized for smaller dimensions. Therefore, a method is needed for determining how to make pellicles that can be used for the smaller device features.

SUMMARY OF THE INVENTION

The present invention provides a method for forming a semiconductor device using a pellicle that has been optimized as described in the accompanying claims.

DETAILED DESCRIPTION OF THE PREFERRED EMBODIMENTS

As device dimensions shrink (e.g., to 45 nm or less), during photolithography steps light travels through a pellicle at non-normal angles (i.e., any angle substantially different (e.g., greater than 10 degrees) from one that is perpendicular (or normal) to the pellicle.) As used herein all degrees are measurements from the normal. Thus, 0 degrees is the normal. The inventors have discovered that for photolithographic patterning of device dimensions at 45 nm or less, the non-normal angles of light travelling through a traditional thin (less than 3 um thick) pellicle will have a significant negative impact upon the patterning process. Therefore optimizing the pellicle for light that travels normal to the pellicle, as is done in the prior art, does not optimize the pellicle for the light that passes through the pellicle at these non-normal angles.

Figure 1:
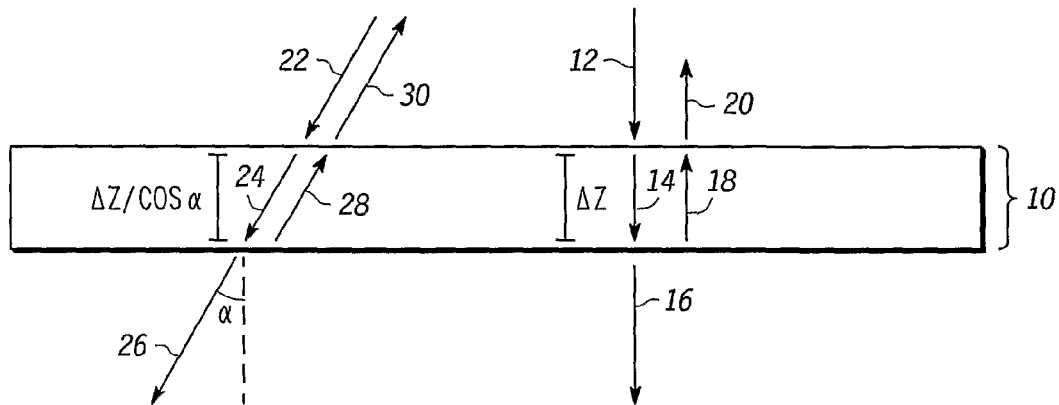
FIG. 1 is a cross section of a pellicle in accordance with one embodiment of the invention, given by way of example.

Illustrated in FIG. 1 is a pellicle 10 having a thickness, $\Delta Z$. Light 12 is normal to the pellicle 10 and travels through the pellicle 10, as light 14. Some of the light is reflected back as light 18, which then leaves the pellicle as light 20. The light 20 leaves the pellicle on the same side of the pellicle 10 that light 12 entered the pellicle. Thus, as will be better understood after further explanation, the light 20 is not used to pattern a layer on a semiconductor substrate because it exits the pellicle 10 on the same side of the pellicle that it enters as the light 12. Thus, light 20 does not travel through the pellicle 10. In contrast, the non-reflected light travels through the pellicle and leaves the pellicle as light 16 at the opposite side that light 12 entered the pellicle. The distance traveled by the light 14 that travels through the pellicle 10 is the thickness, $\Delta Z$, of the pellicle. As will be better understood after further explanation, the light 16 may be used to pattern a layer on a semiconductor substrate.

In contrast to the light 12, light 22 enters the pellicle 10 at an angle relative to the pellicle 10. A portion of the light 12 travels through the pellicle as light 24 a distance greater than the thickness, $\Delta Z$. More specifically, the light 24 travels a distance that is the thickness, $\Delta Z$, divided by $\cos \alpha$. However, like light 12, some of the light 22 is reflected within the pellicle 10 as light 28, which then leaves the pellicle as light 30 on the same side of the pellicle 10 as light 22 entered the pellicle 10. The light that is not reflected exits the pellicle as light 26 at the opposite side that the light 22 entered the pellicle and may be used to pattern a layer on a semiconductor substrate. The angle $\alpha$ is the angle between the light 26 leaving the pellicle and the normal direction to the pellicle 10, specifically the bottom of the pellicle 10. The bottom of the pellicle 10 is the side the light 16 exits the pellicle 10. If the transmission of the pellicle is optimized for the light 16, the pellicle will also not be optimized for the light 26 leaving the pellicle because the light 14 travels a distance that is the thickness of the pellicle, $\Delta Z$, and the light 24 travels a distance that is the thickness of the pellicle, $\Delta Z$, divided by $\cos \alpha$. Therefore, optimization of the pellicle 10 is needed.

Figure 2:
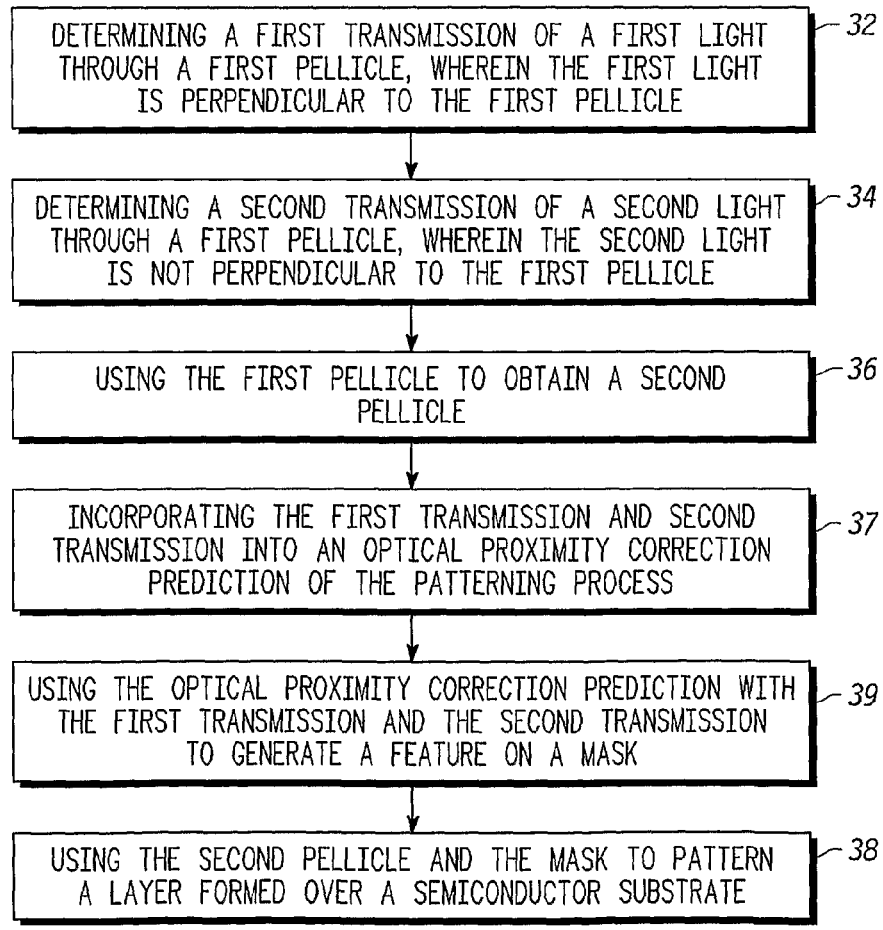
FIG. 2 is a method for obtaining a second pellicle by using a first pellicle in accordance with one embodiment of the invention, given by way of example.

Illustrated in FIG. 2 is a method 130 for using a first pellicle to obtain a second pellicle. In one embodiment, this includes modifying a first manufacturing process, which is used to form the first pellicle to form a second manufacturing process, which is used to form the second pellicle. First, the first transmission of a first light (e.g. the light 12), which is normal to the first pellicle, is determined 32. Next, a second transmission of a second light (e.g., the light 22) at an angle other than a normal angle is determined 34 for a predetermined pellicle. In one embodiment, the predetermined pellicle is a traditional pellicle that has only one layer. In other words, the second light is not normal to the first pellicle. In one embodiment, the angle chosen is the greatest angle that would occur in photolithographic patterning. For example, the angle might be greater than or equal to 10 or 12 degrees. In another embodiment, the angle is actually a range of angles, such as 10 to 15 degrees.

In one embodiment, the first and second transmissions are determined based on measured values of transmission at various angles using a photo-detector containing a photo-multiplier tube. The measuring may be performed at one time or over a period of time. In another embodiment, the measuring may be performed separately for the two different polarization modes (i.e., transverse electric and transverse magnetic) of incident non-normal light. In yet another embodiment, the first and second transmissions are determined based on indirect measuring, such as simulations using Fresnel and Snell's equations.

In one embodiment, based on the determined transmissions, the pellicle is optimized so that the transmission intensities of the light that enters the pellicle at both normal and non-normal angles are more similar to each other when they exit the pellicle 10. In other words, a first pellicle is modified 36 to form a second pellicle, using the first transmission and the second transmission, as illustrated in FIG. 2. The transmitted intensities of the exiting light at normal and non-normal angles are more similar to each other when the different distances they travel through the pellicle 10 do not result in differences in phase and transmission percentages. In one embodiment, the pellicle is a polymer material, such as an organic fluoropolymer. The pellicle may be optimized in various ways; the methods described below can be used alone or together to optimize the pellicle.

In some embodiments, optimizing the pellicle includes modifying the film properties of the first pellicle. In one embodiment, the thickness of the first pellicle is decreased. However, if the films are thinner the intensity difference between the distances traveled through the pellicle by light that is normal to the pellicle and light that enters the pellicle at a non-normal angle is decreased. In other words, the thinner the pellicle the more similar the distances traveled by the non-normal incident light and the normal incident light and hence, the more similar the intensity transmission. Therefore, it is desirable that the films be as thin as possible, such as less than approximately 5 microns, or more preferably less than approximately 3 microns, or more preferably less than approximately 0.7 micron. The thickness chosen preferably is that which provides the highest transmission for all angles of light that will be used in the subsequent photolithography process. In another embodiment, the thickness of the pellicle is modified so that it is not a preferred thickness for transmission of the light that is normal to the pellicle. Instead, a thickness is chosen that provides less transmission of the light that is normal to the pellicle and more transmission of the light that is travelling at a maximum angle to the pellicle. In one embodiment, the average of the desired thickness for the normal light and maximum angled light is chosen. In another embodiment, any thickness that is better for light travelling through the pellicle at the largest angles and worse for the normal light is chosen. This last embodiment is most useful if the maximum angle of any light that enters the pellicle is approximately 15 to 20 degrees.

As described above the thickness of the pellicle may be modified. The thickness could be the overall thickness of the pellicle, which may include one layer or multiple layers. In another embodiment, the thickness of each layer of the pellicle is modified, if the pellicle includes multiple layers. In some embodiments, a multilayer pellicle is used. The multilayer pellicle includes at least two layers. (A multilayer pellicle may be more desirable than a single layer pellicle because it may have improved pellicle transmission uniformity at multiple angles than a single layer pellicle.) The different layers may have a different index of refraction. The thickness and the index of refraction for each layer may be optimized so that the light that is travelling through the pellicle at the maximum angle with respect to the pellicle has sufficient transmission. In one embodiment, sufficient transmission is approximately 95% transmission. In one embodiment, a layer having a thickness of approximately 500 nanometers and an index of refraction of approximately 1.53 is formed over a layer having a thickness of approximately 500 nanometers and an index of refraction of approximately 1.8. Therefore, in one embodiment two layers having approximately greater than or equal to 10% difference in index of refraction may be used.

In another embodiment, the pellicle has a graded index of refraction. The graded index of refraction can be from a graded layer that is used alone or multiple layers that together form a graded index of refraction. In the embodiments where the pellicle includes a graded layer, a graded layer can be used alone or as one or more of the layers of a multilayer pellicle. The graded layer(s) is (are) graded with respect to the wavelength of the light that is used for the subsequent photolithography process. Thus, if photolithography is performed with 193 nm light then the graded layer is graded with respect to 193 nm light. The graded layer is formed so that the index of refraction varies with the depth of the graded layer. Thus, one surface of the graded layer will have a different index of refraction then the other surface of the graded layer.

A graded layer can be formed by the convention processing. In one embodiment, the graded layer is formed by exposing the layer with a wavelength that is different than that subsequently used in the photolithography process and is absorbed by the layer. The wavelength will react with the top of the layer to change the index of refraction in the region where the reaction is performed. In one embodiment, a process is similar to those used making holographic films is used. In one embodiment, a polymer film which is highly transparent to 193 nm light but which strongly absorbs 157 nm light can be exposed to 157 nm light. The absorption of 157 nm light can induce chemical changes in the polymer film that cause changes in the refractive index. Because of the absorption of 157 nm light in the polymer film, the intensity of the 157 nm light within the polymer film will be a function of the distance from the surface of the polymer film. Therefore, the resulting refractive index will also be a function of the distance from the surface of the polymer film.

In another embodiment, the first pellicle may be modified by adding a layer to the pellicle. As described above, the layer may be a graded layer. In another embodiment, a coating, such as an anti-reflective coating, may be applied to the first pellicle. In one embodiment, a first organic polymer coating soluble in a first solvent (for example, an organic solvent) is spin coated into a first thin pellicle film. A second organic polymer coating soluble in a second solvent (for example, water) may be spin coated on top of the first thin pellicle film to create a thin pellicle having two layers. To avoid swelling of the first pellicle film, the first organic polymer preferably is not soluble in the second solvent. Both the first and second coatings may be organic fluoropolymers, but if they are they contain different functional groups. In one embodiment, the first thin pellicle film has a thickness of 40 to 70 nm and a refractive index of 1.80 and the second thin pellicle film may have a thickness of approximately 35 nm thick and in conjunction with a mask a refractive index of 1.45. In this embodiment, the second thin pellicle film acts as a quarter-wave anti-reflective coating for incident light with a wavelength of 193 nm. In another embodiment, a three layer thin pellicle is created by placing an approximately 35 nm second thin pellicle film both on top of and below the first thin pellicle film.

In another embodiment, a first organic polymer is pulled from a polymer pull, which is a mass of dry heated polymer, to form the first thin pellicle film. A second thin anti-reflective film is vapor deposited onto the first pellicle film. The second film can be either inorganic or organic material. The combination of the first and second films creates a two layer pellicle. Multiple additional films can be vapor deposited onto the first pellicle film to create a multilayer pellicle.

After modifying 36 the first pellicle manufacturing process to form a second pellicle, the second pellicle and the mask are used 38 to pattern a layer on a semiconductor substrate as part of a method for patterning a layer on a semiconductor substrate, which is a step for forming a semiconductor device. As will be discussed below, the apparatus 180 shown in FIG. 3 can be used to pattern the layer on the semiconductor substrate.

After the first and second transmissions are determined, the first and second transmissions are incorporated 37 into an optical proximately correction (OPC) prediction of the patterning or photolithography process. (The incorporation and following step of using the OPC process to generate features should be performed before using 38 the second pellicle. However, the incorporation or the following step of using the OPC process to generate features can be performed, after, before, or simultaneously with step 36.) For example, a model of the patterning behavior of the apparatus 180 (shown in FIG. 3) can be used to obtain optimum features sizes on the semiconductor substrate. (Prior art optimizations of mask feature sizing which use models of the photolithography process have not incorporated the light transmission through the pellicle as a function of the angle of light entering the pellicle.) In one embodiment, the transmission intensity versus incident light angle upon the pellicle can be described as a spatial frequency filter in an optical system. This spatial frequency filter can be incorporated into the OPC process using the prior art methods of incorporating lens aberrations or lens apodization into OPC optical image simulations. The incorporation of the spatial frequency filter will modify the OPC wafer light intensity calculations to more accurately match the behavior of the apparatus 180 of FIG. 3. Conventional OPC software can be used, such as that sold by Mentor Graphics® headquartered in Wilsonville, Oreg. or Synopsys, Inc. headquartered in Mountainview, Calif. The OPC process is then used 39 to generate features, such as predetermined feature sizes, on the mask that will be used with the second pellicle to pattern a layer on a semiconductor substrate. Conventional processes can be used to generate the features on the mask.

Figure 3:
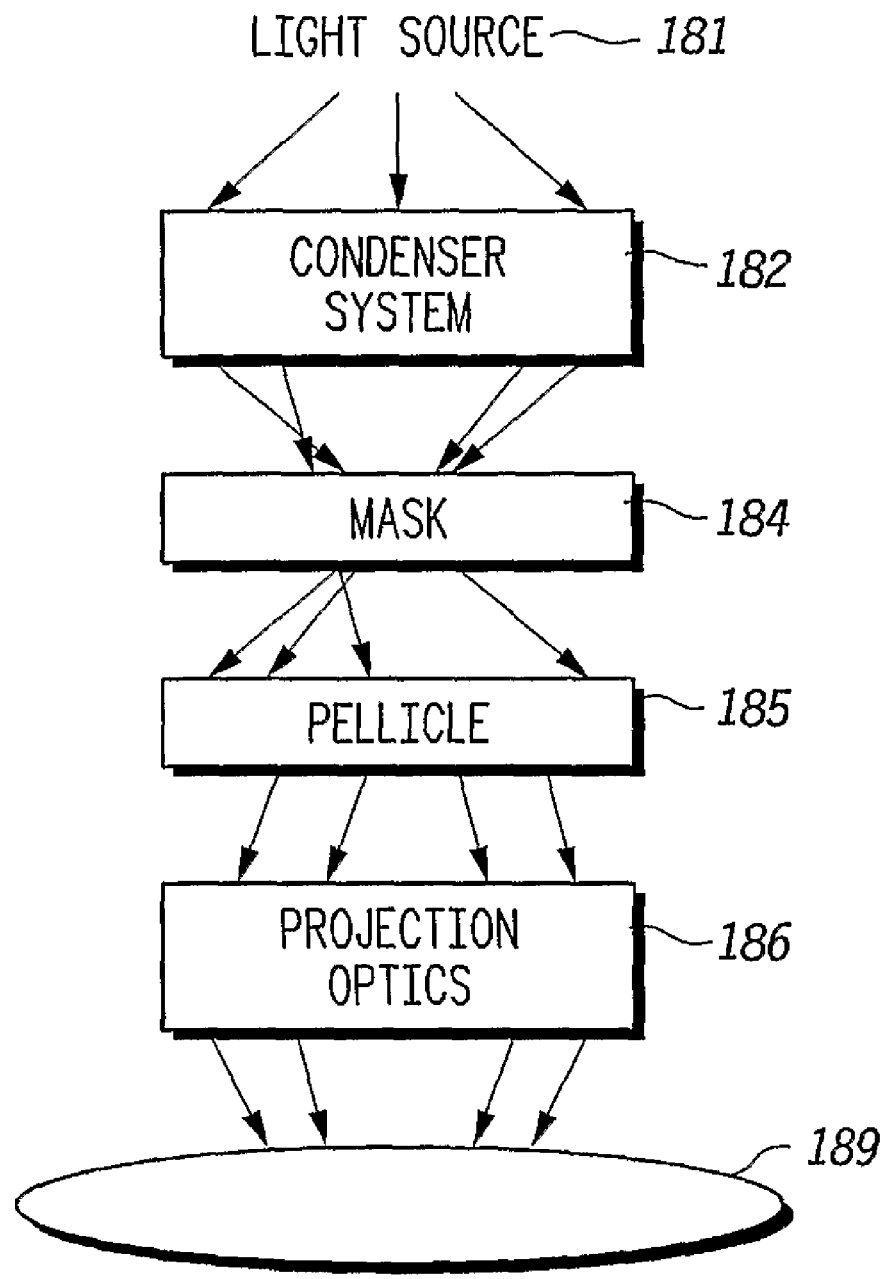
FIG. 3 is an illustration of an apparatus for forming a patterned semiconductor layer using the pellicle formed from the method of FIG. 2, in accordance with one embodiment of the invention, given by way of example.

Shown in FIG. 3 is the apparatus 180 that can be utilized in exposing a mask 184 using a pellicle 185, which is the second pellicle in the method of FIG. 2. The apparatus 180 comprises a light source 181, a condenser system 182, the mask 184, the pellicle 185, projection optics 186, and a semiconductor wafer 189 placed into the apparatus, wherein the semiconductor wafer 189 has a photoresist layer overlying it. The condenser system 182 receives light generated from the light source 181 and applies it to the entire mask 184 that has the features to be applied to the wafer 189. In one embodiment, the features include the features that result from the OPC steps 37 and 39 in FIG. 2. The mask 184 then blocks portions of the light received from the condenser system 182. Light travels through the mask 184 and through the pellicle 185, which prevents airborne contaminants from getting on the mask 184, to the projection optics 186. The projection optics 186 then focuses the light on the photoresist so that photoresist is selectively exposed according to a pattern present on the mask 184. Conventional processing continues to form a semiconductor device.

In one embodiment, the transmitted intensity is not completely uniform for all angles of light travelling through the pellicle 185. For example, the transmitted light intensity for an angle of approximately 15 degrees may be higher than the transmitted light intensity at a normal angle. This difference in transmitted intensity through the pellicle 185 may alter the patterning of a layer on a semiconductor substrate. To more accurately define features on the wafer 189, this difference in transmitted light intensity through the pellicle 185 can be included in when running OPC of the patterning performance of the apparatus 180.

Because in another embodiment the pellicle 185 is modified so that the transmission of light at any angle through it is more similar, the light that is transmitted to the projection optics 186 and finally to the wafer 189 should have similar intensities to the light transferred from the mask 184 to the pellicle 185. By now it should be appreciated that there has been provided a method for forming a layer on a semiconductor layer using a modified pellicle. When using the modified (second) pellicle the light that enters it at a normal angle exits the pellicle as light that is substantially similar in intensity to light that exits the pellicle but entered the pellicle at a non-normal angle. The percent transmission and intensity between the light that entered the pellicle at different angles are similar. In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

The invention claimed is:

1. A method for patterning a layer over a semiconductor substrate, the method characterized by:
    forming the layer over the semiconductor substrate; and
    exposing the layer to light, wherein:
        the light travels through a second pellicle, wherein the second pellicle has a thickness less than approximately 5 microns; and
        the second pellicle is manufactured by a method that is characterized by:
            determining a first transmission of a first light through a first pellicle, wherein the first light is normal to the first pellicle;
            determining a second transmission of a second light through the first pellicle, wherein the second light is not normal to the first pellicle; and incorporating the first transmission of the first light and the second transmission of the second light into an optical proximity correction prediction process; and using the optical proximity correction prediction process to generate a feature on the second pellicle.

2. The method as claimed in claim 1, wherein using the first pellicle to obtain the second pellicle is further characterized by using the first pellicle to obtain the second pellicle, wherein the second pellicle has thickness less than 1 micron.

3. The method as claimed in claim 1, wherein using the first pellicle to obtain the second pellicle is further characterized by using the first pellicle to obtain the second pellicle, wherein the second pellicle includes a first layer and a second layer over the first layer, wherein the first layer has an index of refraction that is greater than the second layer.

4. The method as claimed in claim 3, wherein using the first pellicle to obtain the second pellicle is further characterized using the first pellicle to obtain the second pellicle, wherein the index of refraction of the first layer and the index of refraction of the second layer are at least 10% different.

5. The method as claimed in claim 1, wherein using the first pellicle to obtain the second pellicle is further characterized by using the first pellicle to obtain the second pellicle, wherein the second pellicle has a graded index of refraction.

6. The method as claimed in claim 1, wherein using the first pellicle to obtain the second pellicle is further characterized by increasing a transmission intensity of light travelling through the first pellicle so that the second pellicle has a second transmission intensity of light travelling at a non-normal angle and the first pellicle has a first transmission intensity of light travelling at the non-normal angle, wherein the second transmission intensity is greater than the first transmission intensity.

7. The method as claimed in claim 1, wherein determining the second transmission of the second light through the first pellicle is further characterized by determining the second transmission of the second light through the first pellicle, wherein the second light enters the first pellicle at an angle greater than 12 degrees relative to the first pellicle.

8. The method as claimed in claim 1, wherein using the first pellicle to obtain the second pellicle is further characterized by altering an intensity of the light travelling through the second pellicle at a normal angle to be more similar to the intensity of the light travelling through the second pellicle at a non-normal angle.

9. The method as claimed in claim 1, wherein using the first pellicle to obtain the second pellicle is further characterized by adding a layer to the first pellicle to form the second pellicle.

10. A method for patterning a layer over a semiconductor substrate, the method characterized by:

forming the layer over the semiconductor substrate; and exposing the layer to light, wherein:

the light travels at a first angle and at second angle through a pellicle and a mask, wherein the first angle is normal to the pellicle; the second angle not normal to the pellicle; and the mask includes a feature; and the pellicle is manufactured by a method that is characterized by:

determining a first transmission of light through the pellicle at the first angle;

determining a second transmission of light through the pellicle at the second angle;

incorporating the first transmission and the second transmission of light into an optical proximity correction prediction of the patterning process; and using the optical proximity correction prediction with the first transmission and the second transmission to generate a feature on the mask.

* * * * *

UNITED STATES PATENT AND TRADEMARK OFFICE
CERTIFICATE OF CORRECTION

| | | |
|---|---|---|
| PATENT NO. | : 7,935,547 B2 | Page 1 of 1 |
| APPLICATION NO. | : 12/279672 | |
| DATED | : May 3, 2011 | |
| INVENTOR(S) | : Lucas et al. | |

It is certified that error appears in the above-identified patent and that said Letters Patent is hereby corrected as shown below:

In the Specification

In Column 6, Line 54 change "substrate, the method characterized by:" to --substrate, comprising:--

In Column 6, Lines 60-61 change "method that is characterized by" to --method comprising--

In the Claims

In Column 8, Line 16 change "substrate, the method characterized by:" to --substrate, comprising:--

In Column 8, Lines 23-24 change "method that is characterized by" to --method comprising--

Signed and Sealed this
Eighth Day of October, 2013

Teresa Stanek Rea
*Deputy Director of the United States Patent and Trademark Office*